(12) United States Patent
Perner

(10) Patent No.: US 6,317,375 B1
(45) Date of Patent: Nov. 13, 2001

(54) METHOD AND APPARATUS FOR READING MEMORY CELLS OF A RESISTIVE CROSS POINT ARRAY

(75) Inventor: Frederick A. Perner, Palo Alto, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/652,807

(22) Filed: Aug. 31, 2000

(51) Int. Cl.$^7$ ...................................... G11C 7/00
(52) U.S. Cl. ............. 365/206; 365/189.11; 365/207; 365/208
(58) Field of Search ................. 365/206, 207, 365/208, 189.11, 158

(56) References Cited

U.S. PATENT DOCUMENTS

| | | | |
|---|---|---|---|
| 4,636,988 | * 1/1987 | Tran | 365/208 |
| 5,619,149 | * 4/1997 | Lavi et al. | 327/51 |
| 5,731,731 | * 3/1998 | Wilcox et al. | 327/403 |
| 6,034,909 | * 2/2000 | Brady | 365/208 |
| 6,055,178 | * 4/2000 | Naji | 365/158 |

\* cited by examiner

Primary Examiner—Son T. Dinh

(57) ABSTRACT

A sense amplifier applies an operating potential to a selected bit line and an equal potential to a subset of unselected lines during a read operation on a memory cell in a resistive cross point array of an information storage device. Before a resistance state of the selected memory cell is sensed, however, an input of the sense amplifier is forced to a known, consistent condition. The sense amplifier input may be forced to the known, consistent condition by pulling up the input to an array voltage.

16 Claims, 6 Drawing Sheets

US 6,317,375 B1

METHOD AND APPARATUS FOR READING MEMORY CELLS OF A RESISTIVE CROSS POINT ARRAY

BACKGROUND OF THE INVENTION

The present invention relates to data storage devices. More specifically, the present invention relates to a data storage device including a resistive cross point array of memory cells and a method and apparatus for sensing resistance states of the memory cells in the array.

Magnetic Random Access Memory ("MRAM") is a non-volatile thin-film memory that is being considered for data storage. A typical MRAM device includes an array of memory cells. Word lines extend along rows of the memory cells, and bit lines extend along columns of the memory cells. Each memory cell is located at a cross point of a word line and a bit line.

The MRAM memory cells may be based on spin dependent tunneling ("SDT") junctions. A typical SDT junction has a pinned ferromagnetic layer, a sense ferromagnetic layer and an insulating tunnel barrier sandwiched between the ferromagnetic layers. A logic value may be written to an SDT junction by applying a magnetic field that sets the SDT junction's magnetization orientation to either parallel (logic '0') or anti-parallel (logic '1'). Relative orientation and magnitude of spin polarization of the ferromagnetic layers determine the resistance state (R or R+ΔR) of the SDT junction.

Polymer memory is another non-volatile thin-film memory that is being considered for data storage. A polymer memory device also includes an array of memory cells, with word lines extending along rows of the memory cells, and bit lines extending along columns of the memory cells. The polymer memory cell includes a memory element that is based on polar conductive polymer molecules. Data is stored as a "permanent polarization" in a polymer molecule (in contrast to an SDT junction, where data is stored as a "permanent magnetic moment"). Polymer memory elements may be written by applying electric fields. Resistance state (R or R+ΔR) of a polymer memory element is dependant upon the orientation of polarization of the polymer molecules.

The logic value stored in the thin-film memory element may be read by sensing the resistance state of the memory element. During a read operation on a selected memory cell, an operating potential may be applied to the bit line crossing the selected memory cell, and a ground potential may be applied to the word line crossing the selected memory cell. Consequently, a sense current flows through the memory element of the selected memory cell. This sense current indicates the resistance state of the memory element.

However, the memory cells in the array are coupled together through many parallel paths. The resistance seen at one cross point equals the resistance of the memory cell at that cross point in parallel with resistances of memory cells in the other rows and columns. In this regard, the array of memory cells may be characterized as a cross point resistor network.

To prevent sneak path currents from obscuring the sense current, an equal operating potential is applied to a subset of unselected lines (e.g., the unselected bit lines). This "equipotential method" allows the sense current to be read reliably without the use of diodes or switches for blocking the sneak path currents. The "equipotential" method is disclosed in assignee's U.S. Ser. No. 09/564,308 filed Mar. 3, 2000, issued as U.S. Pat. No. 6,259,644, and incorporated herein by reference.

It is an objective of the present invention to reduce the amount of time for sensing the resistance states of the memory cells.

SUMMARY OF THE INVENTION

According to one aspect of the present invention, a sense amplifier is used to perform a read operation on a selected memory cell in a resistive cross point array of memory cells. An input of the sense amplifier is forced to a known, consistent condition; and then the sense amplifier is used to sense a resistance state of the memory cell.

Other aspects and advantages of the present invention will become apparent from the following detailed description, taken in conjunction with the accompanying drawings, illustrating by way of example the principles of the present invention.

DETAILED DESCRIPTION OF THE INVENTION

Figure 1:
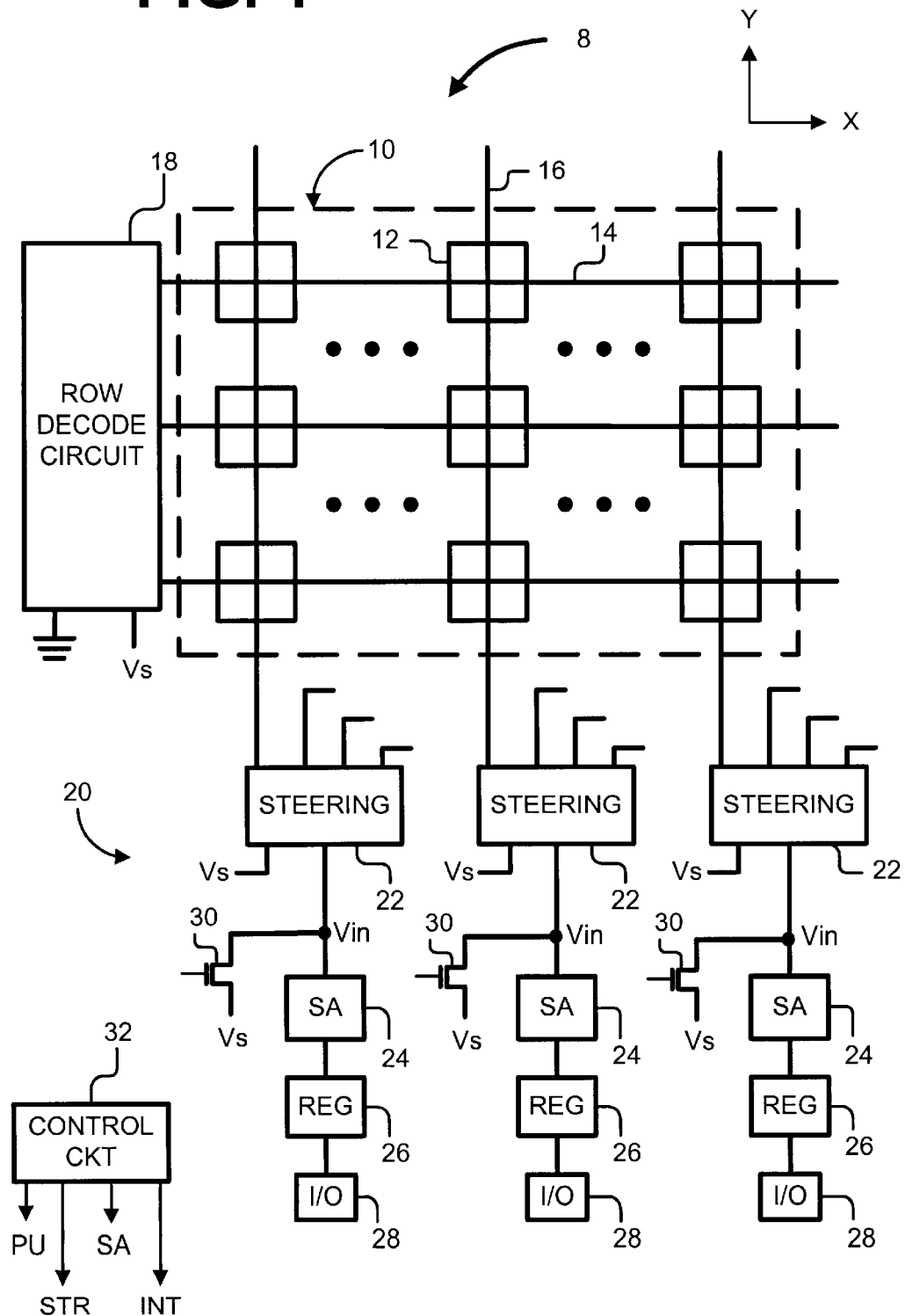
FIG. 1 is an illustration of an information storage device according to the present invention.

As shown in the drawings for purposes of illustration, the present invention is embodied in an information storage device including an array of memory cells and at least one sense amplifier for reliably sensing resistance states of selected memory cells. During a read operation on a selected memory cell, a sense amplifier applies an operating potential to a selected bit line and an equal potential to a subset of unselected word and bit lines. Before a resistance state of the selected memory cell is sensed, an input of the sense amplifier is forced to a known, consistent condition. Applying the equal potential to the subset of unselected lines can prevent parasitic currents from interfering with the read operation on the selected memory cell. Forcing the sense amplifier input to the known, consistent condition reduces the time for sensing the resistance state of the selected memory cell.

Reference is made to FIG. 1, which illustrates an information storage device 8 including a resistive cross point array 10 of memory cells 12. The memory cells 12 are arranged in rows and columns, with the rows extending along an x-direction and the columns extending along a y-direction. Only a relatively small number of memory cells 12 are shown to simplify the explanation of the device 8. In practice, arrays of any size may be used.

Traces functioning as word lines 14 extend along the x-direction in a plane on one side of the memory cell array 10. Traces functioning as bit lines 16 extend along the y-direction in a plane on an opposite side of the memory cell array 10. There may be one word line 14 for each row of the array 10 and one bit line 16 for each column of the array 10. Each memory cell 12 is located at a cross point of a corresponding word line 14 and bit line 16.

The memory cells 12 may include thin-film memory elements. For example, data may be stored in a memory element as a "permanent magnetic moment" (in the case of MRAM technology) or a "permanent polarization" (in the case of polymer memory technology). Magnetic memory elements may be written by applying magnetic fields via the word and bit lines 14 and 16, whereas polymer memory elements may be written by applying electric fields via the word and bit lines 14 and 16. Resistance (R or R+ΔR) of an MRAM memory element is dependant upon the orientation of magnetization of a free layer, whereas resistance (R or R+ΔR) of a polymer memory element is dependant upon the orientation of polarization of polymer molecules.

The device 8 also includes a row decode circuit 18. During read operations, the row decode circuit 18 may apply either a constant array voltage (Vs) or a ground potential to the word lines 14. The constant array voltage (Vs) may be provided by an external circuit.

The device 8 further includes a read circuit for sensing the resistance states of selected memory cells 12 during read operations and a write circuit for orienting the magnetization of selected memory cells 12 during write operations. The read circuit is indicated generally at 20. The write circuit is not shown in order to simplify the explanation of the device 8.

The read circuit 20 includes a plurality of steering circuits 22 and sense amplifiers 24. Multiple bit lines 16 are connected to each steering circuit 22. Each steering circuit 22 includes a set of switches that may connect each bit line 16 to a source of operating potential or a sense amplifier 24. An output of the sense amplifier 24 is supplied to a data register 26, which, in turn, is coupled to an I/O pad 28 of the device 8.

The read circuit 20 further includes a plurality of pull-up transistors 30. During a read operation on a selected memory cell 12, a pull-up transistor 30 pulls up an input voltage (Vin) of the sense amplifier 24. The input voltage (Vin) is pulled up to the array voltage (Vs). Then the sense amplifier 24 senses a resistance state of the selected memory cell 12. By pulling up the sense amplifier input to the array voltage (Vs), the pull-up transistor 30 forces the sense amplifier input to a known, consistent condition. As will be explained below in connection with FIGS. 2a to 5, forcing the sense amplifier input to the known, consistent condition reduces the time for performing the read operations.

The device 8 also includes a control circuit 32 for generating an address strobe signal (STR), an integrator control signal (INT) that controls "settle" and "integration" phases of the read operations, a signal (SA) that controls the reset, preset, arm and store of the sense amplifiers 24, and a signal (PU) that controls the sequencing of the pull-up transistors 30 relative to the operation of the sense amplifiers 24. The control circuit 32 generates other signals for controlling the read and write operations. The control circuit 32 may be implemented as a state machine close to the memory cell array 10.

In the alternative, an external memory controller may generate the control signals.

Figure 3:
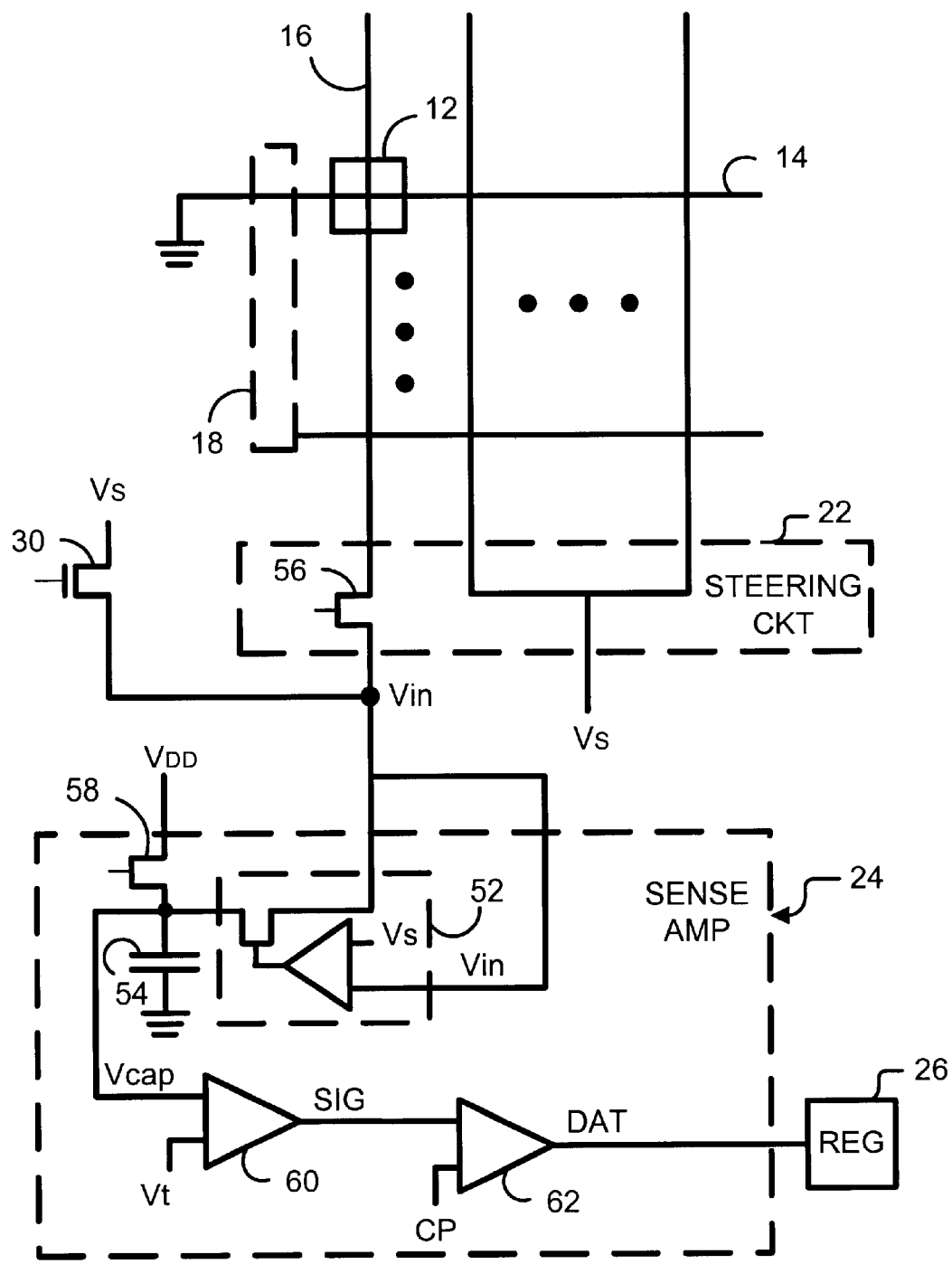
FIG. 3 is an illustration of an exemplary sense amplifier for the device of FIG. 1.

FIG. 3 shows an exemplary sense amplifier 24, which includes a direct injection charge amplifier 52 and an integration capacitor 54. A steering circuit switch 56 coupling the charge amplifier 52 and capacitor 54 to the selected bit line will be referred to as the first switch 56. A second switch 58, which is part of the sense amplifier 24, couples the capacitor 54 to a source providing a $V_{DD}$ voltage.

The first switch 56 is closed to connect the selected bit line to the sense amplifier 24 and the second switch 58 is closed to charge the capacitor 54 to the $V_{DD}$ voltage. When the pull-up transistor 30 is pulsed, the sense amplifier input is charged to the array voltage (Vs).

Figure 2A:
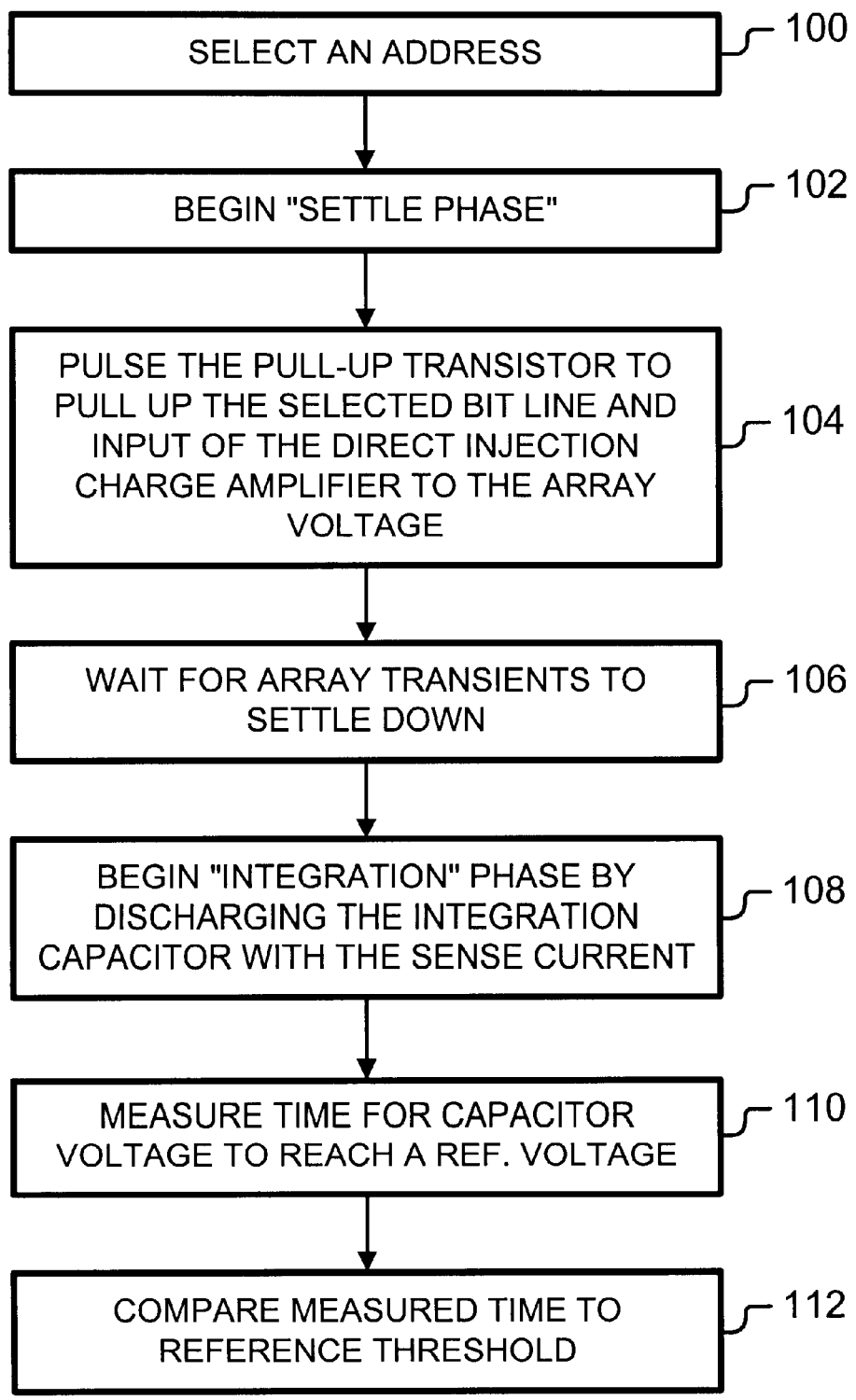
FIGS. 2a and 2b are illustrations of a method of reading a memory cell in the device of FIG. 1.
Figure 2B:
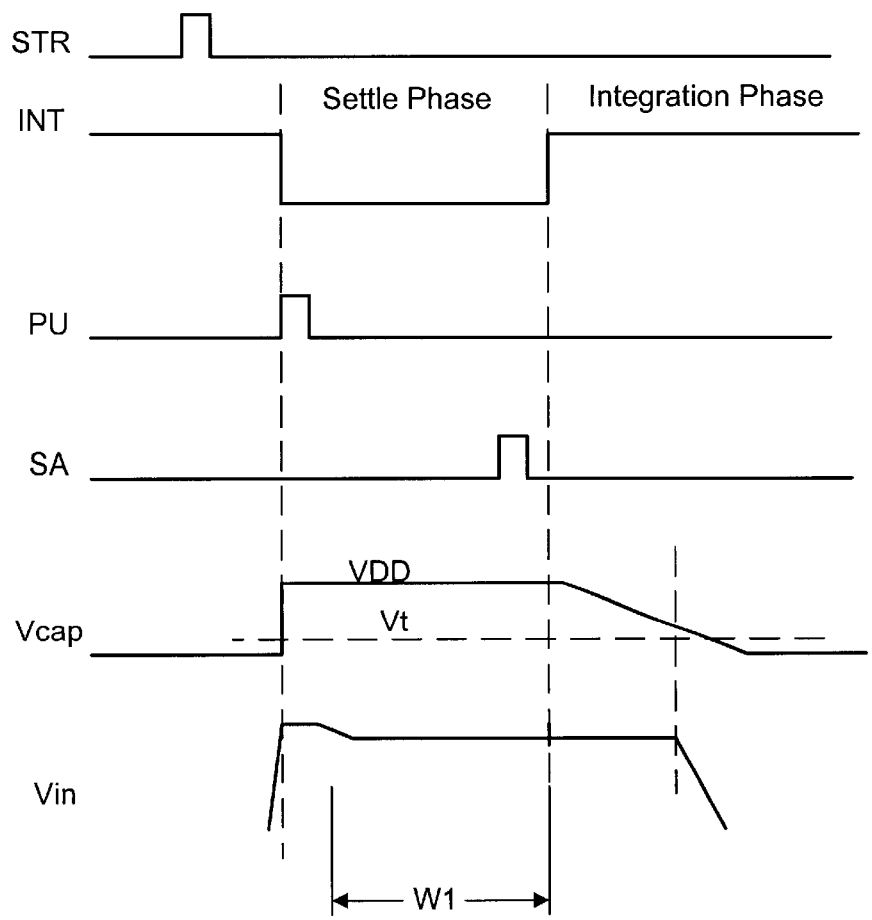

Additional reference is made to FIGS. 2a and 2b, which illustrate a method of using the direct injection charge amplifier 52 and integration capacitor 54 to apply an equal potential to the array 10 during a read operation on a selected memory cell. At the beginning of a read operation, an address is selected (block 100) by connecting a selected word line 14 to the ground potential (the address select strobe signal STR sets the word line address), a selected bit line 16 to an input of the direct injection charge amplifier 52 and a subset of unselected lines to the array voltage (Vs). The voltage (Vs) applied to the unselected lines has the same magnitude as the voltage applied to the selected bit line. Thus, sneak path currents do not interfere with the sense current.

Next, the settle phase is initiated by connecting an output of the direct injection charge amplifier 52 to the $V_{DD}$ voltage (block 102). Shortly after the settle phase is initiated, the pull-up transistor 30 is pulsed by the control signal PU (block 104). Because the pull-up transistor 30 has low impedance, the selected bit line 16 and the input voltage (Vin) of the direct injection charge amplifier 52 are charged up quickly to the array voltage (Vs). Consequently, a known initial condition is applied to the selected bit line 16.

When the pull-up transistor 30 is turned off, the selected bit line voltage decays to an operation voltage that depends upon offset parameters of the direct injection charge amplifier. The direct injection charge amplifier 52 applies a regulated voltage (Vs) to the selected bit line 16.

A wait time (W1) is imposed to allow all voltage and current transients in the sense amplifier 24 to settle down to very low levels (block 106). If the direct injection charge amplifier 52 is ideal and does not have an offset, the sense current becomes stable immediately and the current may be sensed immediately. In practice, however, the direct injection charge amplifier 52 has an offset. The offset causes transients in the sense current. These transients should be allowed to settle before sensing the sense current.

Once the transients have settled, an integration phase begins. Just before the integration phase begins, however, the sense amplifier 24 is reset, preset and armed by the control signal SA.

Figure 4:
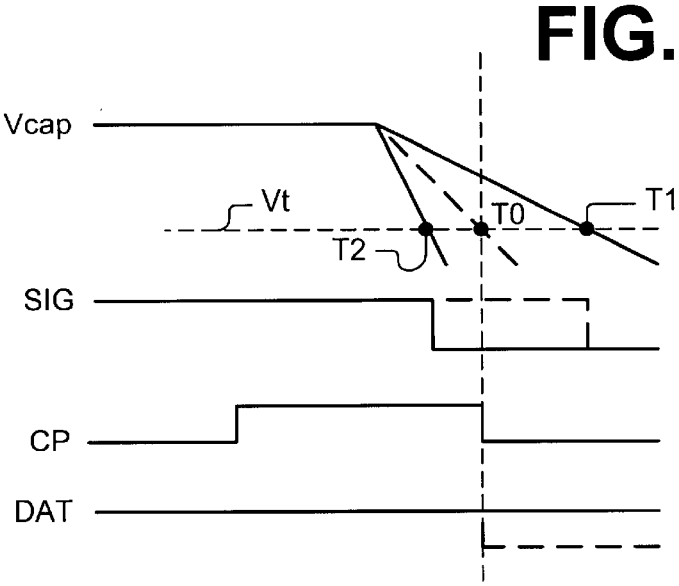
FIG. 4 is an illustration of signals generated during a read operation by the hardware implementation of FIG. 3.

Additional reference is now made to FIG. 4. The integration phase begins by discharging the integration capacitor 54 with the sense current (block 108). The voltage (Vcap) on the integration capacitor 54 decays at a rate that is dependent upon the resistance of the selected memory cell 12. The capacitor voltage (Vcap) will fall slower if the selected memory cell 12 has a higher resistance (R+ΔR) and the capacitor voltage (Vcap) will fall faster if the selected memory cell 12 has a lower resistance (R).

The time for the capacitor voltage (Vcap) to decay to a reference voltage (Vt) is measured (block 110), and the measured time is compared to a threshold (block 112). A first comparator 60 compares the capacitor voltage (Vcap) to a threshold voltage (Vt). The resistance state of the selected memory cell 12 and, therefore, logic value of the selected memory cell 12 can then be determined according to the time for reaching the threshold voltage (Vt).

For example, a second comparator 62 may compare an output of the first comparator 60 to a clock pulse (CP), which transitions from high to low (or vice versa) at a specific time. An output of the second comparator 62 provides a data signal (DAT) to the data register 32. If the capacitor voltage (Vcap) drops below the threshold voltage (Vt) before the clock pulse CP transitions, the data signal (DAT) indicates a logic value (indicated by the solid line) corresponding to the low cell resistance (R). If the capacitor voltage (Vcap) drops below the threshold (Vt) after the clock transitions, the data signal (DAT) provides a logic value (indicated by the dashed line) corresponding to the high cell resistance (R+ΔR).

The threshold voltage (Vt) may be a dc voltage that is less than the $V_{DD}$ voltage but greater than the array voltage (Vs). That is, Vs<Vt<$V_{DD}$. The transition of the clock pulse (CP) may occur at a time (T0) between a first switching threshold time (T1) of the high resistance state and a second switching threshold time (T2) of the low resistance state. Both the threshold voltage (Vt) and the clock pulse (CP) may be generated by an external reference circuit.

Figure 5:
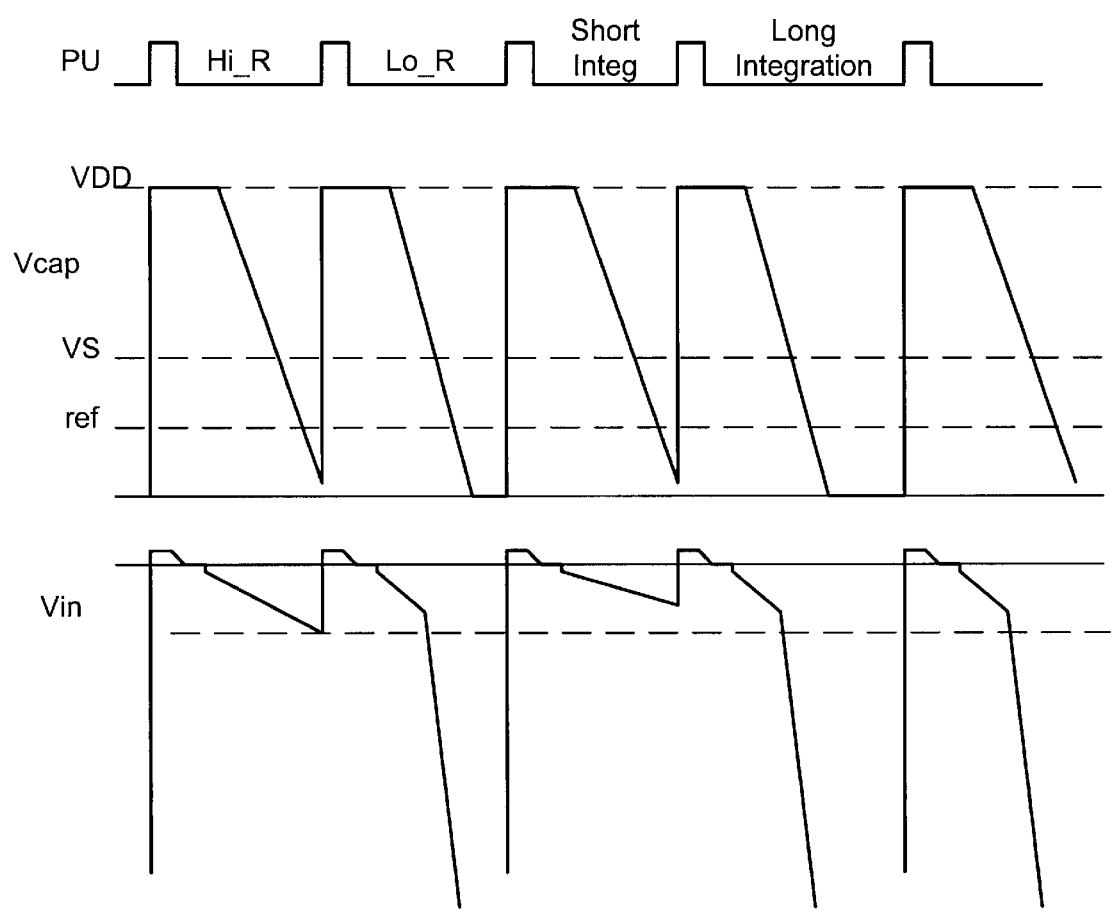
FIG. 5 is an illustration of capacitor voltage and sense amplifier input voltage during a series of read operations.

FIG. 5 shows the capacitor voltage (Vcap) and sense amplifier input voltage (Vin) over four read operations. During each read operation, the pull-up transistor 30 is pulsed (by control signal PU) before the sense current is integrated. Although the pull-up transistor 30 is pulsed for a finite duration, that finite duration is shorter than the time for the transients to settle out. For example, the finite duration may be 10% of the settle time.

The first read operation is performed on a selected memory cell having a high resistance state, the second read operation is performed on a selected memory cell having a low resistance state, the third read operation is performed for a short integration time, and the fourth read operation is performed for a long integration time. For each read operation, the sense amplifier input starts at the same voltage.

Without the pull-up transistor 30, the initial condition at the beginning of the "settle" phase dictates the duration of the "settle" phase. Short integration times and sensing high resistance values would normally lead to the charge amplifier 52 operating in a linear mode and voltages in the charge amplifier 52 being above saturation levels. Resulting would be a shorter "settle" phase. Long integration times and sensing low resistance values would lead to an initial condition of the charge amplifier operating in saturation. Resulting would be a longer "settle" phase.

With the pull-up transistor 30, however, all four read operations begin at the same voltage on the sense amplifier input. As a result, each of the four read operations has a short 'settle' phase.

Figure 6A:
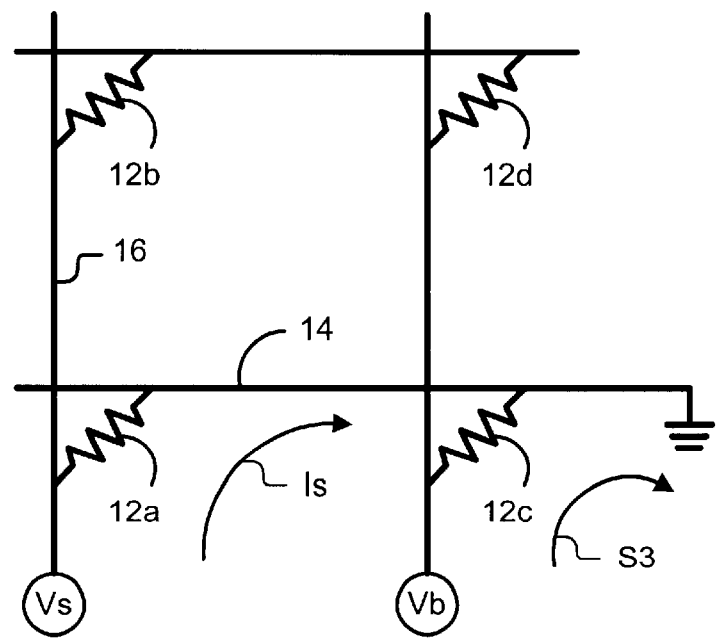
FIGS. 6a and 6b are illustrations of sense and sneak path currents flowing through an electrical equivalent of a resistive cross point array of the device shown in FIG. 1.
Figure 6B:
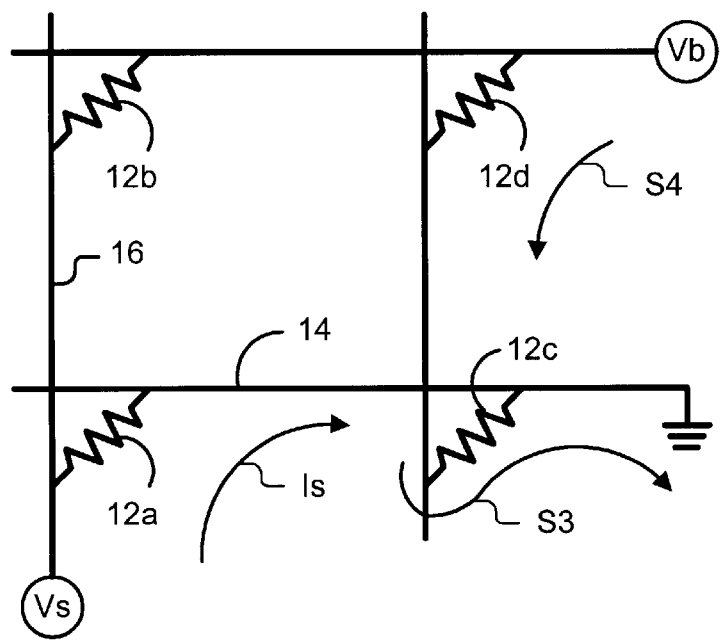

FIGS. 6a and 6b show how the equipotential method prevents sneak path currents from interfering with the read operations. FIG. 6a shows an electrical equivalent of the memory cell array 10. A selected memory cell is represented by a first resistor 12a, and unselected memory cells are represented by second, third and fourth resistors 12b, 12c and 12d. The second resistor 12b represents the unselected memory cells along the selected bit line, the third resistor 12c represents the unselected memory cells along the selected word line, and the fourth resistor 12d represents the remaining unselected memory cells. If, for example, all of the memory cells 12 have a nominal resistance of about R and if the array 10 has n rows and m columns, then the second resistor 12b will have a resistance of about R/(n−1), the third resistor 12c will have a resistance of about R/(m−1), and the fourth resistor 12d will have a resistance of about R/[(n−1)(m−1)].

The first resistor 12a may be selected by applying the array voltage (Vs) to the crossing bit line and a ground potential to the crossing word line. Consequently, a sense current ($I_s$) flows through the first resistor 12a. However, the second, third and fourth resistors 12b, 12c and 12d are also coupled between the array voltage (Vs) and the ground potential.

To mitigate the effects of sneak path currents during read operations, the same operating potential Vb=Vs is applied to the unselected bit line. If Vb=Vs, sneak path currents will be blocked from flowing through the second and fourth resistors 12b and 12d, and a sneak path current S3 flowing through the third resistor 12c will be directed to the ground potential and, therefore, will not interfere with the sense current ($I_s$).

In the alternative, the effects of the sneak path currents may be mitigated by applying the same operating potential Vb=Vs to the unselected word line, as shown in FIG. 6b. A sneak path current will be blocked from flowing through the second resistor 12b. Sneak path currents S3 and S4 flowing through the third and fourth resistors 12c and 12d will be directed to the ground potential and, therefore, will not interfere with the sense current ($I_s$).

Thus, applying an equal potential to the unselected bit or word lines of the array 10 can eliminate or reduce the obscuration of the sense current ($I_s$). Consequently, the sense current ($I_s$) and, therefore, the resistance state of the selected memory cell are determined reliably.

Thus disclosed is an information storage device in which resistance states of memory cells can be sensed reliably and quickly during read operations. Sneak path currents are blocked or re-directed so as not obscure sense currents during read operations. The pull-up transistors force the read operations to begin at the same initial condition for every read. The initial condition is achieved, quickly and independently of the resistance state of the memory cell. Quickly pulling up the sense amplifier input and consistently starting at the same initial voltage reduces the time to wait for the transients to settle and reduces the time for performing the read operations.

The sense amplifier is not limited to any particular type. However, the sense amplifier of FIG. 3 is preferred.

The reference voltages and other reference signals (e.g., thresholds) may be generated in any number of ways. For example, a reference voltage may be established by a simple resistive network of dummy memory cells. Other examples of generating reference voltages are provided in the assignee's U.S. Ser. No. 09/598,671 filed Jun. 20, 2000.

The memory cells of the resistive cross point array are not limited to any particular type of memory element. For instance, MRAM elements could include giant magnetoresistance ("GMR") memory elements.

The present invention is not limited to the specific embodiments described and illustrated above. Instead, the invention is construed according to the claims that follow.

What is claimed is:

1. A method of using a sense amplifier to read a memory cell in a memory cell array, a plurality of traces crossing memory cells of the array, each memory cell being at a cross point of two traces, the method comprising:

forcing an input of the sense amplifier to a known, consistent condition; and using the sense amplifier to sense a resistance state of the memory cell after the sense amplifier input has been forced to the condition, the sense amplifier applying an operating potential to a selected trace and an equal potential to a subset of unselected traces.

2. The method of claim 1, wherein the input is forced by pulsing the input to a known voltage.

3. The method of claim 1, wherein the input is forced to an array voltage.

4. A method of using a sense amplifier to read a memory cell, the method comprising:

forcing an input of the sense amplifier to a known, consistent condition; and using the sense amplifier to sense a resistance state of the memory cell after the sense amplifier input has been forced to the condition;

wherein a wait time is imposed between forcing the sense amplifier input to the known voltage and using the sense amplifier to sense the resistance state, the wait time allowing transients to settle.

5. A method of using a sense amplifier to read a memory cell, the sense amplifier including a capacitor, the method comprising:

forcing an input of the sense amplifier to a known, consistent condition; and using the sense amplifier to sense a resistance state of the memory cell after the sense amplifier input has been forced to the condition;

wherein the memory cell is read by using the capacitor to integrate a sense current and determining the resistance state from capacitor integration time.

6. An information storage device comprising:

a resistive cross point array of memory cells;

a sense amplifier for sensing resistance states of selected memory cells in the array; and a switch for pulling up an input of the sense amplifier to a consistent voltage, the switch having a substantially lower impedance than the sense amplifier.

7. The device of claim 6, wherein the voltage is an array voltage.

8. An information storage device comprising:

a resistive cross point array of memory cells;

a sense amplifier for sensing resistance states of selected memory cells in the array, the sense amplifier including an integration capacitor and a direct injection charge amplifier; and a switch for pulling up an input of the sense amplifier to a consistent voltage.

9. The device of claim 8, wherein the sense amplifier further includes a circuit for determining the resistance state of a selected memory cell according to capacitor integration time.

10. An information storage device comprising:

a resistive cross point array of memory cells;

a plurality of traces crossing the memory cells of the array;

a sense amplifier for sensing resistance states of selected memory cells in the array, the sense amplifier applying an operating potential to a selected trace and an equal potential to a subset of unselected traces during a read operation on a selected memory cell of the array; and a switch for pulling up an input of the sense amplifier to a consistent voltage.

11. The device of claim 10, further comprising a control for causing the switch to pull up the sense amplifier input and the sense amplifier to sense the resistance state after a wait period.

12. The device of claim 10, wherein the device is a magnetic random access memory device.

13. A circuit for performing a read operation on a memory cell of a resistive cross point array, the circuit comprising:

a sense amplifier for sensing a resistance state of the memory cell, the sense amplifier including capacitor and a direct injection charge amplifier for applying an operating potential to a trace crossing the memory cell and at least one unselected trace in the array; and a switch for pulling up an input of the direct injection charge amplifier at the beginning of the read operation, the switch having a substantially lower impedance than the sense amplifier.

14. The circuit of claim 12, wherein capacitor voltage decays during the read operation; and wherein the sense amplifier determines the resistance state according to voltage decay time of the capacitor.

15. An information storage device comprising:

a resistive cross point array of memory cells;

means for using an equipotential method to sense resistance states of selected memory cells in the array; and means for forcing an input of the sensing means to a known, consistent condition prior to sensing the resistance of a selected memory cell.

16. A magnetic random access memory device comprising:

an array of magnetic random access memory cells;

a plurality of word and bit lines crossing the cells, each cell being at a cross point of a word line and a bit line;

a plurality of sense amplifiers;

a plurality of steering circuits, each steering circuit coupling a sense amplifier input to multiple bit lines;

a plurality of pull-up transistors, each pull-up transistor being coupled to a sense amplifier input; and a control circuit for causing the pull-up transistors to pull up the sense amplifier inputs to a known, consistent condition prior to sensing the resistance states of selected memory cells.

* * * * *